United States Patent
Venet et al.

(10) Patent No.: US 6,748,645 B1
(45) Date of Patent: Jun. 15, 2004

(54) METHOD OF OBTAINING A MODULE INCLUDING AN INDUCTIVE WINDING

(75) Inventors: Norbert Venet, La Salvetat St Gilles (FR); Claude Drevon, Toulouse (FR); Stéphane Albinet, Plaisance du Touch (FR)

(73) Assignee: Alcatel, Paris (FR)

( * ) Notice: Subject to any disclaimer, the term of this patent is extended or adjusted under 35 U.S.C. 154(b) by 90 days.

(21) Appl. No.: 09/628,804

(22) Filed: Jul. 28, 2000

(30) Foreign Application Priority Data

Jul. 29, 1999 (FR) .............................. 99 09860

(51) Int. Cl.[7] .......................... H01F 7/06; H01F 7/128; H01F 7/18
(52) U.S. Cl. .................... 29/602.1; 29/604; 29/841; 29/606; 29/417; 336/83; 336/96; 336/200; 264/272.19; 264/158
(58) Field of Search .................... 29/602.1, 604, 29/830, 841, 412, 417, 605; 336/83, 96, 200; 264/272.11, 272.19, 157, 158

(56) References Cited

U.S. PATENT DOCUMENTS

| | | | |
|---|---|---|---|
| 3,483,499 A | | 12/1969 | Lugten |
| 3,657,808 A | * | 4/1972 | Zickar et al. .............. 29/602.1 |
| 3,772,773 A | * | 11/1973 | Hankey et al. ............. 29/602.1 |
| 5,142,767 A | * | 9/1992 | Adams et al. ................ 29/606 |
| 5,377,403 A | * | 1/1995 | Hart et al. ............. 264/272.11 |
| 5,598,135 A | * | 1/1997 | Maeda et al. ................ 336/83 |
| 5,640,760 A | * | 6/1997 | Val et al. ..................... 29/841 |
| 5,699,025 A | * | 12/1997 | Kanoh et al. ................. 29/830 |
| 5,781,093 A | * | 7/1998 | Grandmont et al. ......... 336/200 |
| 5,801,611 A | * | 9/1998 | Van Loenen et al. ......... 336/83 |
| 5,959,846 A | * | 9/1999 | Noguchi et al. ............. 361/782 |
| 6,073,339 A | * | 6/2000 | Levin ........................ 29/602.1 |

FOREIGN PATENT DOCUMENTS

| | | | | |
|---|---|---|---|---|
| EP | 0 267 822 A1 | | 5/1988 | |
| EP | 0 682 365 A1 | | 11/1995 | |
| EP | 0 782 154 A1 | | 7/1997 | |
| JP | 63-88814 | * | 4/1988 | .............. 29/602.1 |
| JP | 64-72517 | * | 3/1989 | .............. 29/602.1 |

* cited by examiner

*Primary Examiner*—A. Dexter Tugbang
(74) *Attorney, Agent, or Firm*—Sughrue Mion, PLLC

(57) ABSTRACT

A method of obtaining a module including at least one inductive winding made up of one or more conductive tracks on a printed circuit film support on which the tracks form turns which are combined to form a winding or a plurality of parallel and/or coaxial windings. The method includes the steps of: stacking a plurality of aligned modular printed circuit film elements carrying a set of turns which are intended to form part of a winding or of a plurality of parallel and/or coaxial windings and whose tracks terminate at or near the edge or one edge of the element that includes them, molding an insulative material over the stacked assembly of modular elements to constitute a rigid block, cutting the molded block laterally along the stack to expose the conductive tracks at a common alignment level and so that they are flush with the surface of one face of the block, which cutting step is performed at least once, and creating connections on the face or faces of the block with which the modular conductive track elements are flush to interconnect them selectively and to connect them to connection means external to the module.

7 Claims, 1 Drawing Sheet

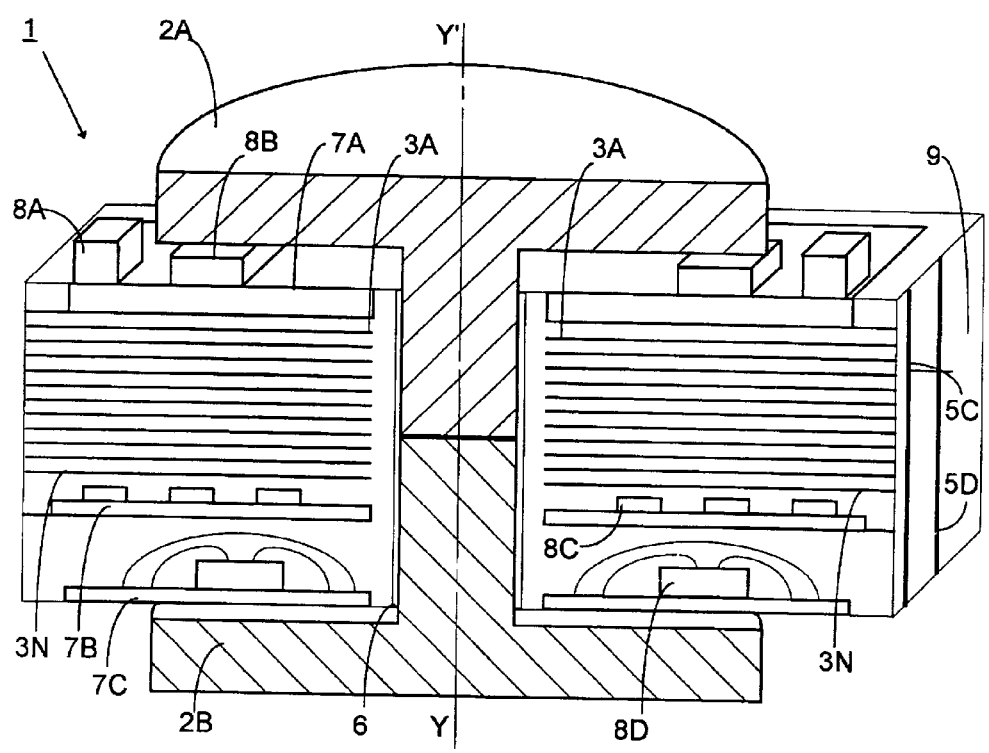

METHOD OF OBTAINING A MODULE INCLUDING AN INDUCTIVE WINDING

BACKGROUND OF THE INVENTION

1. Field of the invention

The invention relates to a method of obtaining a one-piece module including an inductive winding. It also relates to one-piece electronic modules, and in particular to modules with a winding around a magnetic core, obtained by means of the method, for example converter modules.

2. Description of the Prior Art

Producing windings consisting of superposed turns consisting of conductive tracks carried by a printed circuit folded on itself to align the turns along an axis corresponding to the axis of the winding to be obtained is known in the art.

The document U.S. Pat. No. 5,801,611 describes an inductive device obtained in this way using a printed circuit on which winding turns are made on both faces at locations of the circuit which are stacked in parallel planes by multiple folding of the circuit on itself. It is necessary to provide connections passing through the printed circuit to connect the interior end of the spiral assembly made up of turns at a location on the printed circuit to a corresponding end of the spiral assembly according to the winding to be obtained. These connections are conventionally provided in the form of metal-plated holes which pass through the printed circuit to connect each of the two spiral assemblies. Solutions of this kind are relatively costly and relatively difficult to implement and their reliability is not always satisfactory.

SUMMARY OF THE INVENTION

The invention therefore proposes a method of obtaining a module including at least one inductive winding made up of one or more conductive tracks on a printed circuit film support on which the tracks form turns which are combined to form a winding or a plurality of parallel and/or coaxial windings, which method includes the following steps:

stacking a plurality of aligned modular printed circuit film elements carrying a set of turns which are intended to form part of a winding or of a plurality of parallel and/or coaxial windings and whose tracks terminate at or near the edge or one edge of the element that includes them, molding an insulative material over the stacked assembly of modular elements to constitute a rigid block, cutting the molded block laterally along the stack to expose the conductive tracks at a common alignment level and so that they are flush with the surface of one face of the block, which cutting step is performed at least once, and creating connections on the face or faces of the block with which the modular conductive track elements are flush to interconnect them selectively and to connect them to connection means external to the module.

According to the invention, at least one end of a stack of modular elements is associated with one or more supplementary modular printed circuit elements which carry components and which have conductive frocks which terminate at a level corresponding to an alignment level of modular elements of the stack in order to perform the molding, cutting and connection creation steps simultaneously on all the associated modular elements.

In the context of the method according to the invention, an association of this kind enables a complete functional electronic module to be constructed by stacking modular elements and interconnecting all the modular elements by a connection operation common to all the elements.

According to the invention, at least one orifice is formed in the same position in the modular elements adapted to constitute a module to form therein a conduit enabling a core to be inserted through the modular elements.

This enables converter blocks including windings aligned along magnetic cores to be made in a minimum number of operations.

The invention also provides an electronic module in the form of a block which includes at least one inductive winding consisting of one or more conductive tracks on a printed circuit film support on which the tracks form turns which are combined to form the coil or parallel and/or coaxial coils, which module includes a stack of modular printed circuit film elements aligned at one edge at least and each carrying one or more turns which are to form part of a winding or of a plurality of parallel and/or coaxial windings and whose tracks terminate on a particular face at aligned edges of stacked modular elements at which conductive trocks are formed to connect turns to each other.

The resulting module has the advantage that it constitutes a rigid block, for example a cubical or rectangular parallelepipedal block, incorporating a connection network on at least one face.

In one variant of the invention the module is an electronic module incorporating a core and taking the form of a block which indudes at least one winding made up of conductive tracks on a printed circuit film support adapted to form turns, in a particular arrangement, and wherein at least some turns are combined to form a winding, which module indudes a stack of modular printed circuit film elements aligned at one edge at least and each carrying one or more turns which are to form part of a winding or a plurality of parallel and/or coaxial windings and whose tracks terminate at a face defined by aligned edges of stacked modular elements on which are formed conductive connecting tracks for connecting the turns to each other and to connection elements of external connection means, and at least some of the adjacent modules in the stack include identical openings at the center of at least one turn relating to a particular winding to form a passage for a core housed in a conduit formed by successive modules incorporating such openings.

In one variant of the invention, the module is a converter module, for example, and at least one supplementary modular printed circuit element carrying components is embedded in the molded block at one end at least of the stack of elements forming a winding or windings and each supplementary element includes conductive tracks terminating at and electrically connected to conductive tracks formed on a particular face of the block by aligned edges of stacked modular elements.

The invention, its features and its advantages are explained in the following description, which is given with reference to the accompany drawing.

BRIEF DESCRIPTION OF THE DRAWING

The single figure of the accompanying drawing shows an electronic module according to the invention in section. The module includes an inductive winding constructed from conductive tracks forming turns around a magnetic core.

DETAILED DESCRIPTION OF THE PREFERRED EMBODIMENT

The method according to the invention is for obtaining modules induding one or more windings each made up of a plurality of turns in which the conductive member is a conductive track carried by a thin printed circuit, for example a printed circuit formed on a film.

The electronic module 1 shown by way of example in the figure includes an inductive winding around a magnetic core comprising two parts 2A, 2B abutted end-to-end. An arrangement of this kind is intended to constitute a converter, for example.

The module includes one or more windings around the middle tubular part of the core constituted by the two parts 2A and 2B abutted end-to-end. The windings preferably have parallel and/or coaxial axes according to whether they have parallel longitudinal axes or a common axis, in which case they can be concentric or aligned with each other, as required. In the remainder of the description, for simplicity, only one winding is referred to and is assumed to be aligned with the longitudinal axis YY' of the module.

The turns of the winding of the module consist of conductive tracks carried by a printed circuit film, in a manner known in the art, and define stacked repetitive spiral patterns. The stacking is along the longitudinal axis YY' in the module shown. According to the invention, the repetitive patterns are formed on separate modular printed circuit film elements which are intended to be stacked, as shown in the figure for the film elements 3A. In this example, the film elements, such as the elements 3A and 3N, are rectangular in shape and incorporate an opening through which the middle tubular part of the core consisting of the two parts 2A, 2B abutted end-to-end pass. The turns carried by the film elements are formed identically around the central opening of the element that carries them. The conductive tracks which constitute them extend as for as the periphery of the film element that carries them. In a preferred embodiment of the invention the film elements carrying turns which are intended to form part of the some stack preferably have the some dimensions and the conductive tracks forming their turns are reproduced identically on all the film elements.

The film elements which are intended to be stacked are aligned in a jig, for example by means of fixed rods included in the jig over which the film elements are placed, the film elements being provided with appropriate perforations at predetermined locations. The conductive tracks corresponding to the turns can extend to an alignment edge, for example, or can stop at the some distance from that edge. It is equally feasible to align different conductive tracks at different edges, in particular at opposite edges of the elements, if necessary.

In a preferred embodiment of the method according to the invention of obtaining modules, the modular elements, such as the elements 3A, 3N, which are intended to be stacked to constitute a winding are stacked in a jig in which they are superposed exactly one on the other because of their identical dimensions and because they are guided into position by the jig. The corresponding conductive track ends are then aligned, as symbolized by the straight line segment 5C and 5D in the figure. The aligned ends form rows parallel to the stacking axis, which in practice corresponds to the longitudinal axis YY' of the module obtained.

The resulting stack is then embedded in an insulative material, usually a polymer resin, which is hardened to form a block which in this example has regular dimensions. The block is a rectangular parallelepiped, for example. In the case of a module including a magnetic core, the molding process leaves a passage 6 for the core through the modular film elements of the stock.

Supplementary modular printed circuit elements, such as the elements 7A, 7B, 7C, can be associated with at least one end of the stack in order to complete, from the functional point of view, the module which includes the winding obtained by stacking and to indude the whole in the same molded block of insulative material. The supplementary printed circuit modular elements can be single-sided, double-sided or multilayer elements. They are used to mount components, for example surface-mount components (SMC). The components can be position either on the outside of the block, such as the components 8A, 8B, or inside the block, such as the components 8C, 8D. Like the stacked modular elements 3A, 3N, the supplementary modular elements have conductive tracks which extend to an alignment edge of the element or end at the some distance from that edge.

The molding operation then takes place with the assembled modular elements, such as the elements 3A, 3N, 7A, 7B, 7C, disposed in the jig so that the modules are perpendicular to an axis corresponding to the longitudinal axis YY' of the module, along which the modules are pre-positioned, for example using a system of removable shims.

After molding, the resulting block is cut in a direction parallel to the longitudinal axis of the module so that the conductive tracks of the modular elements are flush with at least one lateral face of the molded block of the resulting module, such as the face 9.

Connections are then formed on the face or faces of the block with which the conductive tracks of the modular elements are flush in order to connect the latter to interconnection tracks and/or to connection members of connection means external to the module. In a preferred embodiment of the invention this operation is performed by metallizing at least the face or faces of the block concerned. Selective interconnection conductive tracks between modular elements, such as the elements 5C and 5D, and connection elements for connection means external to the module are thus formed on the metallized face or faces. For example, this is obtained by localized metallization or by metallization followed by selective elimination of the metal deposit sparing in particular the tracks and the areas provided for the connection elements where the conductive tracks of the modular printed circuit elements are flush with the face or faces of the block concerned. The connection elements are of the type conventionally provided for external connection means using balls or conductive tracks, for example of the lead frame type.

The conductive tracks on the faces of the block can be protected by depositing one or more layers of insulative material if required, as is standard practice in the art.

In one particular embodiment, if the core housing 6 provided in the block opens to the exterior of the block, the module is completed by inserting the core. In the example shown, the two parts 2A, 2B of the core are therefore inserted from opposite sides of the module where their respective tubular parts join and are fixed together, for example glued together.

What is claimed is:

1. A method of obtaining a module including at least one inductive winding made up of a plurality of aligned modular printed circuit film elements that are combined to form the at least one inductive winding, which method includes the following steps:

forming a stacked assembly by stacking the plurality of aligned modular printed circuit film elements, each of the plurality of modular printed circuit film elements carrying a set of turns of one or more conductive tracks which form part of the at least one inductive winding, and wherein the one or more conductive tracks terminate at or near an edge of the modular printed circuit film element, molding an insulative material over the stacked assembly of modular printed circuit film elements to constitute a rigid block, cutting the rigid block laterally along the stacked assembly to expose an end for each of the one or more conductive tracks at a common alignment level and so that the exposed ends from the plurality of modular printed circuit film elements are flush with a surface of one face of the block, which cutting step is performed at least once, and creating connections on the one face of the block with which the exposed ends are flush to selectively interconnect the one or more conductive tracks and to connect the one or more conductive tracks to connection means external to the module.

2. The method claimed in claim 1 wherein at least one of the stacked assembly has one or more supplementary modular printed circuit film elements which carry components and which have conductive tracks which terminate at a level corresponding to the common alignment level of the modular printed circuit film elements of said stacked assembly carry the sets of turns of the one or more conductive tracks in order to perform the molding, cutting and connection creation steps simultaneously on the stacked assembly, including the one or more supplementary modular printed circuit film elements which carry components.

3. The method in claim 1 wherein at least one orifice is formed in a same position in each of the modular printed circuit film elements to form a conduit in the stacked assembly enabling a core to be inserted through said stacked assembly.

4. A method of obtaining a module, comprising the steps of:

providing a first support and a second support;

forming at least a first conductive track having turns on the first support to form a winding thereon, wherein the first conductive track terminates at or near an edge of the first support;

forming at least a second conductive track having turns on the second support to form a winding thereon, wherein the second conductive track terminates at or near an edge of the second support;

stacking the first support on top of the second support to form a stacked assembly;

molding an insulative material over the stacked assembly to form a block;

cutting the block laterally along the stacked assembly to expose respective ends of the first and second conductive tracks at a common alignment level and so that the exposed ends are flush with one face of the block; and interconnecting the conductive tracks on the one face of the block.

5. The method claimed in claim 4, further comprising the steps of:

providing a supplementary support that carries an electrical component and that has a conductive track terminating at or near an edge of the supplementary support;

prior to molding the insulative material over the stacked assembly to form the block, stacking the supplementary support with the first support and the second support so that the stacked assembly includes the supplementary support, the first support, and the second support, and so that the step of cutting the block laterally along the stacked assembly exposes respective ends of the conductive tracks on the supplementary support, the first conductive tracks and the second conductive tracks the common alignment level and so that the respective exposed ends are flush with one face of the block.

6. The method claimed in claim 4, wherein at least one orifice is formed in a same position in each of first and second supports to form a conduit in the stacked assembly enabling core to be inserted through the stacked assembly.

7. The method claimed in claim 4, wherein in the steps of forming the first and second conductive tracks, the first conductive track is formed so that the first conductive track terminates at the edge of the first support, and the second conductive track is forms so that the second ductive track terminates at the edge of the second support before performing the stacking step.

* * * * *